(12) United States Patent
Chew

(10) Patent No.: US 10,971,184 B1
(45) Date of Patent: Apr. 6, 2021

(54) DUAL DRIVE TAPE EMBEDDED SYSTEM

(71) Applicant: Western Digital Technologies, Inc., San Jose, CA (US)

(72) Inventor: David W. Chew, San Juan Capistrano, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/858,318

(22) Filed: Apr. 24, 2020

Related U.S. Application Data

(60) Provisional application No. 63/003,275, filed on Mar. 31, 2020.

(51) Int. Cl.
| | |
|---|---|
| *G11B 33/12* | (2006.01) |
| *G11B 5/48* | (2006.01) |
| *G11B 15/18* | (2006.01) |
| *G11B 15/32* | (2006.01) |
| *H05K 1/18* | (2006.01) |
| *G11B 5/008* | (2006.01) |
| *H01R 12/71* | (2011.01) |

(52) U.S. Cl.
CPC ...... *G11B 15/1808* (2013.01); *G11B 5/00813* (2013.01); *G11B 5/4893* (2013.01); *G11B 15/1883* (2013.01); *G11B 15/32* (2013.01); *H05K 1/18* (2013.01); *H01R 12/716* (2013.01); *H05K 2201/10159* (2013.01); *H05K 2201/10189* (2013.01); *H05K 2201/10545* (2013.01)

(58) Field of Classification Search
CPC ....... G11B 5/4853; G11B 5/486; G11B 19/00; G11B 17/00; G11B 15/46; G11B 5/54; G11B 15/68; G11B 15/295; G11B 33/122; G11B 33/126; G11B 15/64
USPC ............. 360/75, 71, 221, 126, 99.23, 261.2, 360/266.3, 271.9, 245.8, 245.9
See application file for complete search history.

(56) References Cited

U.S. PATENT DOCUMENTS

| | | | |
|---|---|---|---|
| 5,913,926 | A  | 6/1999  | Anderson et al. |
| 6,633,449 | B1 | 10/2003 | Anderson et al. |
| 7,474,498 | B2 | 1/2009  | Biskeborn |
| 7,869,154 | B2 | 1/2011  | Kudo et al. |

(Continued)

OTHER PUBLICATIONS

International Search Report dated Oct. 14, 2020 for PCT/US2020/038840.

(Continued)

*Primary Examiner* — Nabil Z Hindi
(74) *Attorney, Agent, or Firm* — Chang & Hale LLP

(57) ABSTRACT

A storage system can include a first tape storage drive (TSD), a second TSD, and a printed circuit board assembly (PCBA) where the first and second TSD are coupled back-to-back, with the PCBA between the two. The first TSD can include a first enclosure, a first head assembly, a first actuator, and a first connector. The second TSD can include a second enclosure, a second head assembly, a second actuator, and a second connector. The PCBA can include a first side having a first mating connector configured to connect to the first connector for the first TSD, a second side opposite the first side, the second side having a second mating connector configured to connect to the second connector for the second TSD, and a controller configured to control activation of the first actuator of the first TSD and the second actuator of the second TSD.

20 Claims, 8 Drawing Sheets

(56) References Cited

U.S. PATENT DOCUMENTS

| | | | |
|---|---|---|---|
| 8,059,355 B2 * | 11/2011 | Nayak | G11B 5/584 360/75 |
| 8,164,857 B2 | 4/2012 | Noguchi et al. | |
| 8,508,928 B2 | 8/2013 | Killen et al. | |
| 2007/0008683 A1 | 1/2007 | Gavit et al. | |
| 2009/0001206 A1 | 1/2009 | Ycas | |

OTHER PUBLICATIONS

International Written Opinion dated Oct. 14, 2020 for PCT/US2020/038840.
International Search Report dated Nov. 11, 2020 for PCT/US2020/038839.
International Written Opinion dated Nov. 11, 2020 for PCT/US2020/038839.

* cited by examiner

DUAL DRIVE TAPE EMBEDDED SYSTEM

CROSS-REFERENCE TO RELATED APPLICATIONS

The present application claims priority to U.S. Provisional Patent Application Ser. No. 63/003,275 filed on Mar. 31, 2020, entitled DUAL DRIVE TAPE EMBEDDED SYSTEM, the disclosure of which is hereby incorporated by reference in its entirety

BACKGROUND

Field

This disclosure relates to tape-based data storage devices. More particularly, the disclosure relates to a data storage device with an embedded tape-based reading and writing mechanism.

Description of Related Art

In certain computing systems, tape storage systems comprise of a tape drive and tape cartridges or cassettes that store tape media (also called tape film or magnetic tape). The tape drive performs writing or reading of data in the cartridges or cassettes, which are separate devices from the tape drive.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1A:
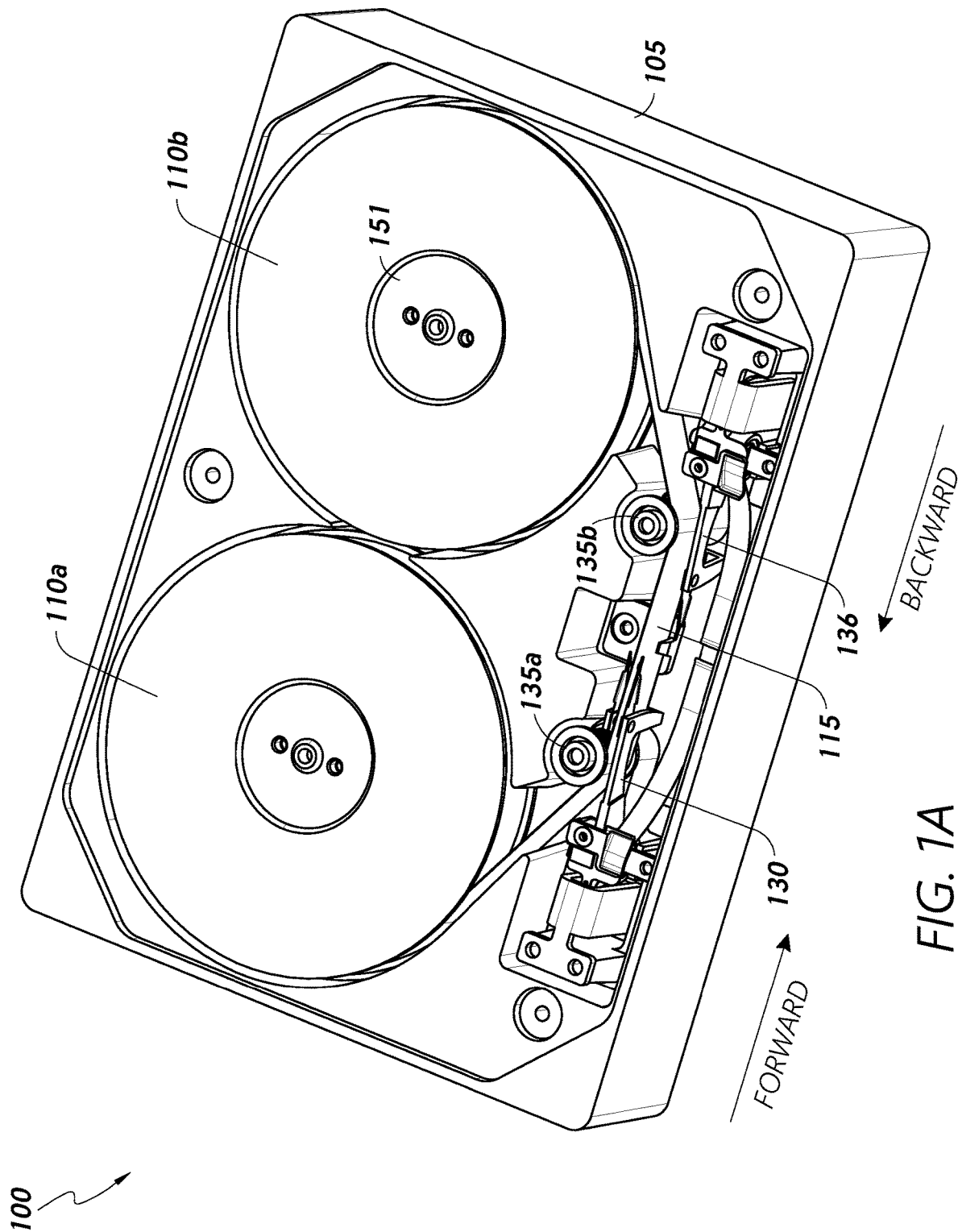
FIGS. 1A-1B illustrate a perspective view and a side profile view of a tape embedded drive 100, in accordance with some embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Although the principles disclosed herein may be applicable to any suitable or practical data storage system or environment, for convenience, certain embodiments are disclosed herein in the context of tape-based data storage systems.

Tape data storage is a system for storing digital information on magnetic tape using digital recording. Tape storage media is most commonly packaged in cartridges and cassettes. A tape drive, a separate device from the tape storage media, performs writing or reading of data in the cartridges or cassettes that are put into the tape drive. Autoloaders and tape libraries can be used to automate cartridge/cassette handling by moving cartridges/cassettes from a library of cartridges to the tape drive and vice versa. A common cassette-based format is Linear Tape Open (LTO), which comes in a variety of densities.

In the context of magnetic tape, the term cassette usually refers to an enclosure that holds two reels with a single span of magnetic tape. The term cartridge is more generic, but frequently means a single reel of tape in a plastic enclosure. For convenience, the disclosure will refer to cassettes, but the described technology can also be applied to cartridges.

The type of packaging is a large determinant of the load and unload times as well as the length of tape that can be held. A tape drive that uses a single reel cartridge has a take-up reel in the drive while cassettes have the take-up reel in the cassette. A tape drive (or "transport" or "deck") uses precisely controlled motors to wind the tape from one reel to the other, passing a read/write head as it does.

Current tape drive library systems have several deficiencies. As tapes are open to the environment, the tape storage facility (e.g., data center) needs to control the humidity and temperature to ensure the reliability of the tape. Such environmental maintenance can be expensive. In addition, even with such maintenance, long-term reliability can still be a problem. For example, variances in temperature or contamination from dust could affect the reliability of the tape drives.

In addition, the robotics used to move a tape cassette from a tape holder in the library to the tape drive system can cause additional delay in reading. For example, access time for both robotics (about average 50 s) and tape drive (about average 50 s) can be about 100 s.

Furthermore, the tape drive system uses an up/down stepping motor and voice coil motor (VCM), called dual stage motors, to move a large writer and reader head bar. At higher tracks per inch (TPI), the large head bar limits the accuracy possible with the dual stage motors. Additionally, the tape drive system needs to support multiple generations of cassettes. The tape drive system may need to write and read data for several types of tape film vendors and recording generations. Maintaining compatibility can limit the possibility of technology improvement.

Tape Embedded Drive Overview

One possible solution to these problems is a tape embedded drive, embodiments of which are discussed below. The tape embedded drive is, in some embodiments, a cassette that integrates or embeds the tape media and the head(s) for reading and writing into the cassette. One or more non-operable heads can be used to provide additional support to the tape media. Further, the cassette can utilize, for example, the 3.5 inch form factor common to hard disk drives (HDD)

or a 5.25 inch form factor for drives, such as compact disc (CD) or digital versatile disc (DVD) drives. The selected form factor can facilitate dual-drive tape embedded systems that can use a single, shared electrical board. Furthermore, the tape embedded drive can utilize other components of hard disk drives, such as heads or electronic boards, to reduce costs and/or gain other efficiencies.

Drive bays for 3.5 inch drives are typically 1 inch (25 mm) high by 4 inches (100 mm) wide by 5.75(147 mm) deep. 3.5 inch form factor drives are roughly the same size as the bay or slightly smaller, though the depth can vary more. A half-height or double height (e.g., 2 inches high) 3.5 inch form factor can also be used. Similar variations can also be made for the 5.25 inch form factor. Drive bays for 5.25 inch form factor are typically 3.25 inches (83 mm) high, 5.75 inches (150 mm) wide and up to 8 inches (200 mm) deep for full-height bays. For half-height 5.25 drive bays, the dimensions are typically 1.625 inches (41 mm) high by 5.75 inches (150 mm) wide by up to 8 inches (200 mm) deep. 5.25 inch form factor drives are roughly the same size as the bay or slightly smaller, though the depth can vary more.

By using a standardized form factor (e.g., 3.5 inch or 5.25 inch), technologies developed for HDDs such as controllers and sealed drive technology can be adapted or otherwise utilized for tape drives. For example, a similar printed circuit board assembly (PCBA) used in HDD drives could be used, providing a standardized interface such as Serial ATA (SATA), Serial Attached SCSI (SAS), or Non-Volatile Memory Express (NVMe) to the host. Further, the PCBA can comprise a system-on-a-chip (SoC) and/or other control circuitry, including, for example, data read channel, memory, motor driver(s) and actuator driver(s).

In addition, using a standardized form factor (e.g., 3.5 inch or 5.25 inch) can provide better integration with existing data center infrastructure. HDDs are commonly used in data centers for storage, with specialized racks and servers designed to utilize 3.5 inch form factor HDDs or 5.25 inch form factor drives. By using the 3.5 inch or 5.25 inch form factor, the tape embedded drive can simplify the maintenance and infrastructure needs of data centers. Rather than having a second set of infrastructure for supporting tape drives, the data center could utilize the same infrastructure to support both HDDs and tape embedded drives such as those described in this disclosure. In certain other embodiments, the same integrated approach can be applied to a non-3.5 inch form factor construction. For example, a 2.5 inch form factor or another generally rectangular form factor may be used. Using a 2.5 inch form factor may also provide the same infrastructure and other benefits mentioned above with respect to the 3.5 inch or 5.25 inch form factors. In certain embodiments, the tape embedded drive may partially conform to the 3.5 inch or other standard form factors, such as, for example, having a taller than 1 inch height (e.g., 2 inches high) while maintaining other dimensions of the 3.5 inch form factor.

Head Stack Assemblies

Figure 1B:
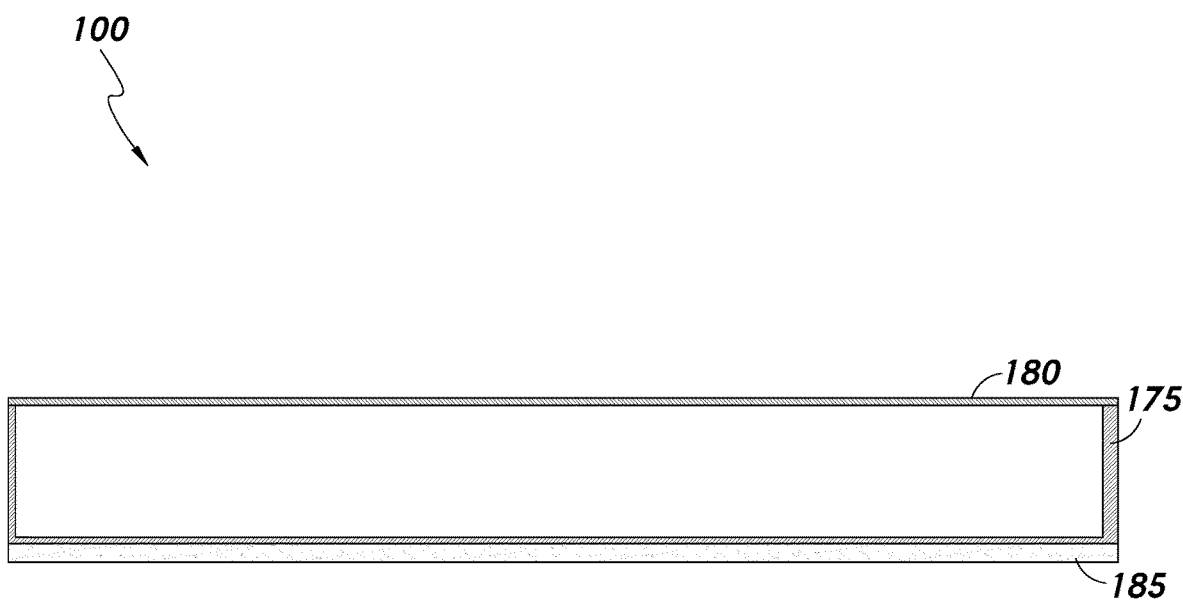

FIGS. 1A-1B illustrate a perspective view and a side profile view of a tape embedded drive 100, according to certain embodiments. In the illustrated embodiment, the tape embedded drive comprises a casing 105, one or more tape reels 110 (two as shown in FIG. 1A), tape media 115, a voice coil motor (VCM) 142, a first head stack assembly (HSA) 130, tape guides/rollers 135a, 135b, and PCBA 185 (shown in FIG. 1 B). Optionally, a second HSA 136 may be located on the other side of the casing from the first HSA 130. In an embodiment, most of the components are within an interior cavity of the casing, except the PCBA 185 which is mounted on an external surface of the casing.

Typically, a printed circuit board (PCB) is a board that electrically connects electronic components using conductive traces, pads, and other features etched from, for example, copper foil laminated onto a non-conductive substrate. PCB's can be single sided (e.g., one copper layer), double sided (e.g., two copper layers), or multi-layer (e.g., outer and inner layers). Conductors on different layers are connected with vias (e.g., plated-through holes). Multi-layer PCB's allow for much higher component density and design complexity. A PCBA is the board after all the components have been soldered and installed on the PCB.

Figure 2:
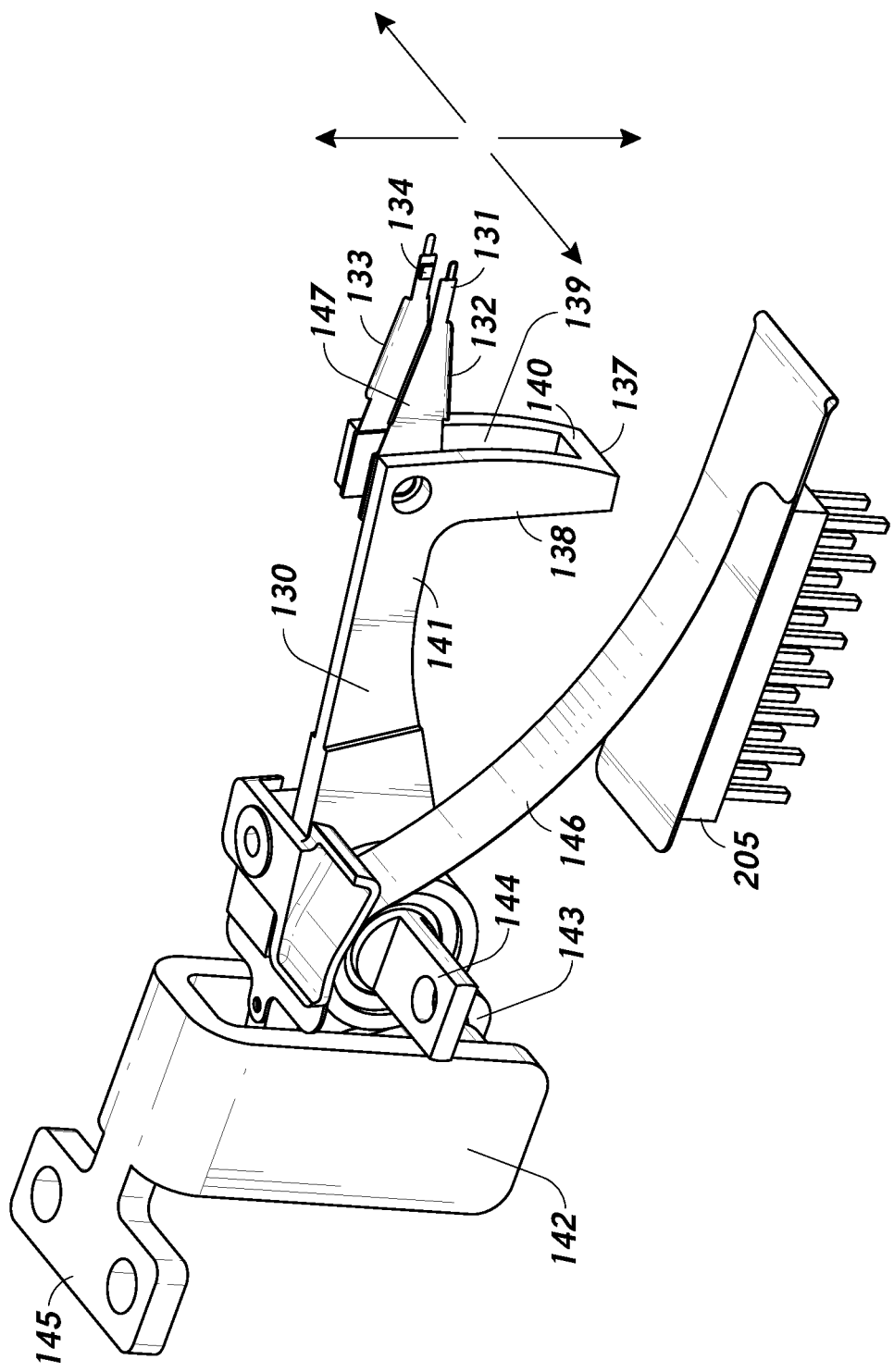
FIG. 2 provides a close-up view of the first head stack assembly of FIG. 1A, in accordance with some embodiments.

FIG. 2 provides a close-up view of the first HSA 130 of FIG. 1A. In some embodiments, the first HSA 130 comprises a first head gimbal assembly (HGA) 132 with a first head assembly 131 having one or more read and write heads and a second HGA 133 with a second head assembly 134 having one or more dummy or non-operable heads that are incapable of reading and writing. The first HGA comprises an elongated suspension or head arm 147 comprising a proximal end near the tape media and a distal end away from the tape media. The head arm can support, on its proximal end, one or more heads, which may be supported by a head slider.

While the one or more read and write heads operate on the front surface of the tape media, the non-operable head(s) can provide support to the tape media 115 as it moves forward or backwards past the first HSA 130. In one embodiment, an air bearing forms between the non-operable head(s) of the second head assembly 134 and the back surface of the tape media, providing a cushion to prevent the head(s) from touching the surface of the tape media 115 and potentially damaging the tape media 115 and the data stored on it. In some embodiments, the non-operable head(s) are shaped like normal heads in order to provide the same or similar fluid dynamics behavior as normal heads, but without the internal components (e.g., magnetic and/or electrical elements) needed for reading or writing.

Air bearings (also known as aerostatic or aerodynamic bearings) are fluid bearings that use a thin film of pressurized gas to provide a low friction load-bearing interface between surfaces. The two surfaces do not touch, thus avoiding the traditional bearing-related problems of friction, wear, particulates, and lubricant handling, and offer advantages in precision positioning, such as lacking backlash and static friction, as well as in high-speed applications. Although the term air bearing is used, in certain embodiments the tape embedded drive may include a sealed enclosure with a gas mixture that has a different composition than that of air (e.g., with certain requisite amount of helium or hydrogen). The principles of operation disclosed with respect to air bearing herein would still apply to those embodiments.

In one embodiment, the first and second HGAs are attached, by the respective distal ends of their head arms to a u-bracket 137 support. A first prong of the u-bracket forms a first side 138 attached to the first HGA, while a second prong forms a second side 139 of the u-bracket opposite to the first die and attached to the second HGA, and a third side connects the first side to the second side, the third side perpendicular to the first and second sides. In one embodiment, the sides of the u-bracket form a channel through which the tape media 115 passes during reading/writing. In one embodiment, the first prong of the u-bracket is attached to an HGA arm 141. Other embodiments may utilize a different attachment point for the HGA arm 141, such as the second prong, the third side, or a different part of the u-bracket. In other embodiments, a different type bracket or other support structure formed around tape can be used instead to support the first and second HGAs, without it being necessarily in the u-shape. For example, the bracket may n-shaped (reversed u-bracket), v-shaped, oval or circular shaped, or a bar above or below the tape.

In an embodiment, the first HGA 132 is attached to the top of the first prong 138, with the second HGA 133 attached to the top of the second prong 139. As shown in the embodiment of FIG. 2, the first HGA 132 is opposite the second HGA 133, with the first head assembly 131 of the first HGA 132 facing the non-operable head(s) of the second head assembly 134 of the second HGA 133. The open space between the first and second head assemblies allows the tape media 115 (not shown) to pass between the heads.

In one implementation, movement of the first HSA 130 is accomplished by the VCM 142, which typically includes a coil attached to the head stack assembly, as well as one or more permanent magnets which establish a magnetic field in which the coil is immersed. The controlled application of current to the coil causes magnetic interaction between the permanent magnets and the coil so that the coil moves. As the coil moves, the first HSA 130 pivots about a pivot point 144 and the head assemblies 131, 134 move across (e.g., up or down) the opposing surfaces of the tape media 115. As a result, the VCM can variably position the head(s) of the first HSA 130 transversely with respect to the width of the recording tape. In an embodiment, servo data can be written to the tape to aid in more accurate positioning of the head(s) along the tape media. The VCM 142 can be attached to the casing 105 (shown in FIG. 1A) via an attachment point 145, for example, using screws, pins, adhesive, or the like.

In one embodiment, the first HSA 130 includes a VCM end 143, which is connected to the HGA arm 141, which is connected to the u-bracket support 137, which is connected to the first HGA 132 and second HGA 133. The VCM end 143 of the HSA 130 can be positioned within the magnetic field generated by the VCM 142, with the VCM coil located at the VCM end and positioned in the magnetic field. In one embodiment, the VCM end 143 is unconnected to any structure, but is freely movable within the magnetic field generated by the VCM 142. The VCM 142 can manipulate the first HSA 130, via the VCM coil, to move up/down and/or side-to-side relative to the pivot point 144. In some embodiments, the pivot point includes an attachment mechanism (e.g., screw, adhesive, fastener, etc.) for attaching the first HSA 130 to the enclosure.

Data from the head(s) 132 of the first HSA 130 can be transferred through a data channel or electrical leads formed on HSA and through a cable 146 (e.g., flex assembly, ribbon cable, twisted pair, etc.) to an output connector 205. The output connector 205 can connect to a PCBA, which in some embodiments is located outside the casing 105. Thus, in some embodiments, at least a portion of the output connector 205 extends outside the casing 105.

In one example movement for parking the heads, the u-bracket 140, with the head gimbal assemblies 132, 133, is moved down such that the head gimbal assemblies move below the tape media 115. The u-bracket can then be moved to the side by the VCM 142 towards the enclosure so that both head assemblies are on the outer side of the tape media 115. The head assemblies can then be parked onto a parking ramp (not shown). The parking ramp can comprise a retention feature (e.g., slot, protrusion, etc.) that hold the heads assemblies in place. The heads can remain on the parking ramp until the VCM 142 moves the u-bracket off the parking ramp, for example, when moving to a reading position over the tape media 115 by reversing the movements describes above.

In some embodiments, the tape embedded drive 100 utilizes a single HSA. Other embodiments can utilize two or more HSAs. For example, as shown in FIG. 1A, the tape embedded drive 100 can include a second HSA 136. In one embodiment, the second HSA 136 is in a mirrored position to the first HSA 130, relative to a vertical center-line of the tape embedded drive 100. For example, the first HSA 130 can be located under the first tape reel 110a, with the second HSA 136 located under the second tape reel 110b. The head(s) of the second HSA 136 are located towards the center of the tape embedded drive, proximal to the head(s) of the first HSA 130.

In one embodiment, the second HSA 136 comprises the same components as the first HSA 130, such as one or more read/write heads and one or more non-operable heads. The second HSA 136 may be structurally identical to the first HSA 130, with the same structure described above with respect to the first HSA 130. For example, the second HSA can include a third HGA with one or more read/write heads and a fourth HGA having non-operable head(s), the fourth HGA opposite the third HGA .

In some embodiments, the first HSA 130 and second HSA 136 work in tandem to provide bi-directional reading/writing of the tape media 115. For example, when tape media 115 moves in a forward direction, the first HSA 130 can be placed over the tape media to perform read/write operations while the second HSA 136 remains in a parked position. When the tape media 115 moves in a backward direction, the second HSA 136 can be placed over the tape media to perform read/write operations while the first HSA 130 remains in a parked position.

By operating together, the performance of the tape embedded drive 100 is increased. Rather than rewinding the tape to a previous position and reading forward, the tape embedded drive 100 can begin reading while the tape is winding to the previous position. By the time the previous position is reached, the second HSA 136 has completed reading the data from the previous position, thus saving having to read forward from the previous position.

In other embodiments, the tape media 115 is dual sided. In some embodiments, the second HSA 136 can read/write a second side of the tape media while the first HSA 130 reads/writes to a first side of the tape media. In those situations, the first and second HSAs can operate at the same time, reading and writing independently on opposite sides of the tape media.

In some embodiments with dual sided tape media 115, the first HSA 130 comprises two sets of working heads, rather than one set of working head(s) and one set of non-operable head(s). In those situations, the two heads on opposite sides of the tape can read both sides of the tape media 115 at the same time. This can double the read or write throughout of the tape embedded drive 100. Similarly, the optional second HSA 136, in some embodiments, can have two sets of working heads. In such embodiments, there may be electrical routing along the u-bracket or other similar support structure to provide an electrical connection to the second head assembly such as the head assembly 134.

Other Components

In FIG. 1A, two tape reels 110 are placed in the interior cavity of the casing 105, with the center of the two tape reels on the same level in the cavity and with the first HSA 130 located under the first tape reel 110a and the second HSA 136. Tape reel motors 151 located in the spindles of the tape reels can operate to wind and unwind the tape film in the tape reels. Each tape reel may also incorporate a tape folder to help the tape film neatly wind onto the reel. The tape media may be made via a sputtering process to provide improved areal density.

Tape film from the tape reels are biased against the guides/rollers 135a, 135b (collectively "135") and are movably passed along the first HSA 130 and second HSA 136 by movement of the reels. The illustrated embodiment shows two guides/rollers 135 bending the tape media to be parallel to the first HSA 130 and the second HSA 136. In some embodiments, additional rollers may be used to provide additional tension to the tape media. In some embodiments, the guides/rollers 135 may have more specialized shapes and differ from each other based on function. For example, they may be cylindrical in shape, flat-sided (e.g., rectangular prism), or clip shaped with two prongs and the film moving between the prongs of the clip.

In addition, the casing 105 can comprise one or more particle filters and/or desiccants (not shown) to help maintain the environment in the casing. For example, if the casing is not airtight, the particle filters may be placed where airflow is expected. The particle filters and/or desiccants can be placed in one or more of the corners or any other convenient place away from the moving internal components. For example, the moving reels may generate internal airflow as the tape winds/unwinds, and the particle filters can be placed within that airflow.

There is a wide variety possible in the placement of the internal components of the tape embedded drive 100 within the casing 105. In particular, as the head mechanism is internal to the casing in certain embodiments, the tape media does not ever have to be exposed outside of the casing, such as in conventional tape drives. Thus, the tape film does not need to be routed along the edge of the casing and can be freely routed in more compact or otherwise more efficient ways within the casing. Similarly, the head(s) and tape reels can be placed in a variety of locations to achieve a more efficient layout, as there is no design requirement to provide external access to these components through the casing.

Casing Components

As shown in FIG. 1 B, the casing 105 comprises a cover 180 and a base 175. The PCBA 185 is attached to the bottom, on an external surface of the casing 105, opposite the cover 180. As the PCBA is made of solid state electronics, environmental issues are less of a concern, so it does not need to be placed inside the casing 105. That leaves room inside the casing for other components, particularly the moving components and film media that benefit from a more protected environment.

In some embodiments the tape embedded drive 100 is sealed. Sealing can mean the drive is hermetically sealed or simply enclosed without necessarily being airtight. Sealing the drive can be good for tape film winding stability, tape film reliability, and tape head reliability. Desiccant may be used to limit humidity inside the casing.

In one embodiment, the cover 180 is used to hermetically seal the tape embedded drive 100. For example, the drive 100 may be hermetically sealed for environmental control by attaching (e.g., laser welding, adhesive, etc.) the cover to the base 175. The drive 100 may be filled by helium, nitrogen, hydrogen or some other typically inert gas.

In some embodiments, other components can be added to the tape embedded drive 100. For example, a pre-amp for the heads can be added to tape embedded drive. The pre-amp may be located on the PCBA 185, in the HSA, or in another location. In general, placing the pre-amp closer to the heads (e.g., in the HGA) can have a greater effect on the read and write signals in terms of signal-to-noise ratio (SNR). In other embodiments, some of the components could be removed. For example, the filters or the desiccant may be left out.

Dual-sided Tape Embedded System

Figure 3A:
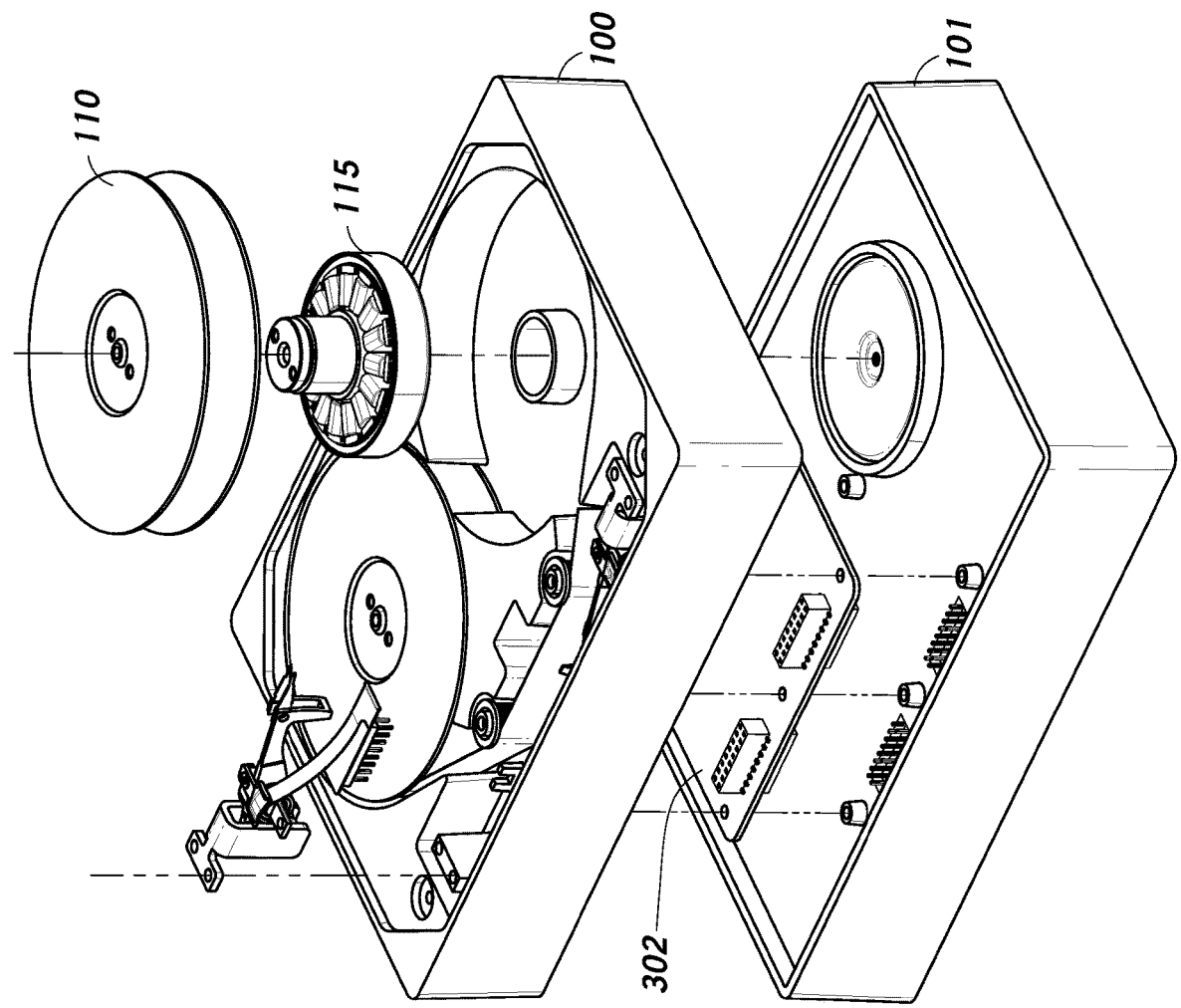
FIG. 3A illustrates a perspective view of a dual-sided tape embedded system 300, in accordance with some embodiments.
Figure 3B:
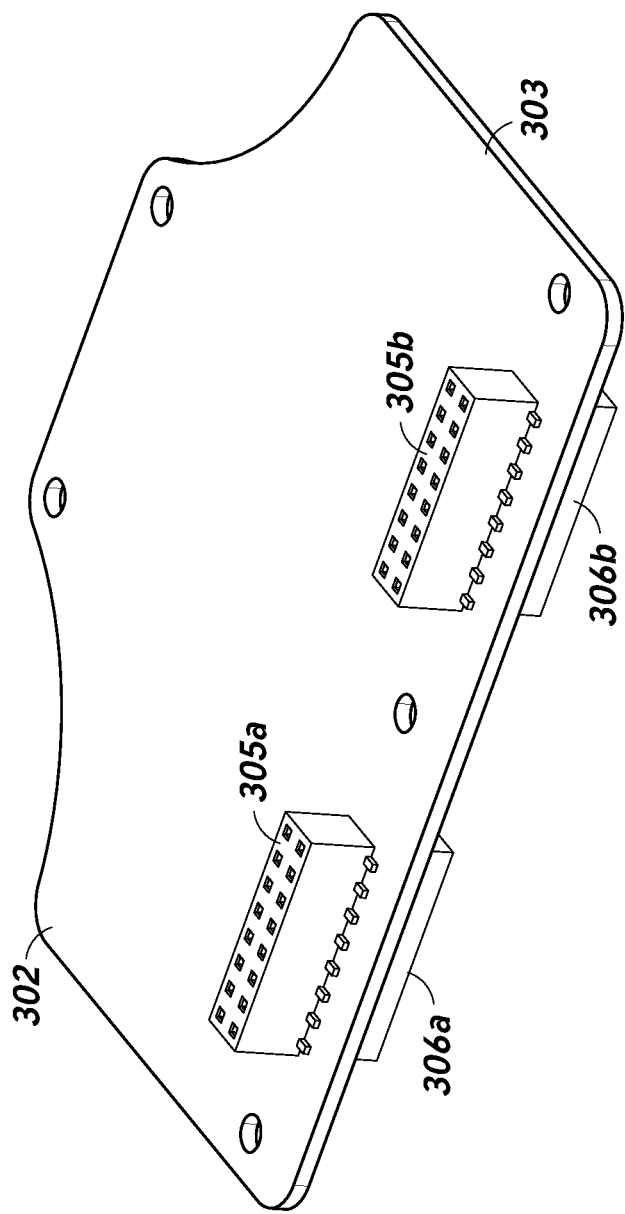
FIG. 3B illustrates a close-up view of a printed circuit board assembly of FIG. 3A, in accordance with some embodiments.

FIG. 3A illustrates a perspective view of a dual-sided tape embedded system 300, according to certain embodiments. FIG. 3B illustrates a close-up view of a PCBA 302 of FIG. 3A, according to certain embodiments. The dual-sided tape embedded system comprises a first tape embedded drive 100, a second tape embedded drive 101, and the PCBA 302. By using a single PCBA to control both tape embedded drives, costs for the system 300 are reduced in comparison to single-drive designs which would utilize a separate PCBA for each tape drive.

The first tape embedded drive is shown in a partially exploded view, with a tape reel 110 pulled away to show the spindle motor 151. In one embodiment, the spindle motor design is similar to a hard disk drive (HDD), utilizing a rotating shaft. Ball bearings similar to those in conventional tape drives can be used in the spindle motor 151.

The second tape embedded drive 101 is shown back-to-back to the first tape embedded drive 100, with the PCBA 302 between the two drives. As shown in FIG. 3B, the PCBA comprises two sets of connectors on a top surface 303 and a bottom surface (not shown) opposite the top surface. A first connector 305a and a second connector 305b are located on the top surface 303 and are configured to connect with the first tape embedded drive 100. A third connector 306a and a fourth connector 306b are located on the bottom surface of the PCBA and are configured to connect with the second tape embedded drive 101. Printed circuits formed on the PCBA 302 connect the connectors to various components of the PCBA, such as one or more processors, memory, data interfaces, or the like.

In some embodiments, the first connector 305a is configured to connect with the output connector 205 (of FIG. 2) of the first HSA 130. Similarly, second connector 305b may be configured to connect to the (optional) second HSA 136. In the embodiment shown, the first connector 305a comprises recesses for receiving a plurality of pins formed on the output connector 205. The other connectors of the PCBA 302 may have similar structure. However, in some embodiments, other types of connectors (e.g., slots, flex cable connectors, etc.) can also be used.

In some embodiments, the PCBA 305 is configured to operate a single tape embedded drive at a time. By limiting capabilities, the PCBA can use less components and/or less powerful components, thereby reducing costs, which is of particular importance in tape storage systems which are typically the lowest cost type of storage system available. Tape systems typically store "cold data," which is only accessed rarely and sporadically. Due to this environment, it's unlikely that data from both tape embedded drives in the tape embedded system 300 will need to be accessed simultaneously. Thus, using a single PCBA 302 to alternately control both tape embedded drives 100, 101 will likely only slow performance in a small number of instances.

In a typical situation, the tape embedded system 300 receives a first request for data in the first tape embedded drive 100 and accesses that data. When the tape embedded system 300 receives a second request for data in the second tape embedded drive 101, enough time will usually have passed that the first request has been completed. The PCBA 302 can then switch to controlling the second tape embedded drive 101 and providing the data for the second request. In situations where the first request and the second request arrive close together or at the same time, the PCBA 302 can fulfill the first request, queue the second the request, and then complete the second request after completing the first request.

In some embodiments, the tape embedded system 300 may employ a priority queue to handle data requests (read or writes). In some situations, the tape embedded system 300 may prioritize requests for a currently active tape embedded drive. For example, if the first request causes the first tape embedded drive 100 to be activated, then a third request for data in the first tape embedded drive 100 may be prioritized over the second request for data in the second tape embedded drive 101, even if the second request were received earlier. Switching between tape embedded drives and locating data in the tape media has certain overhead costs. Thus, prioritizing requests to the currently active tape embedded drive can reduce overall response times as fewer overhead costs (e.g., switching between drives, running through tape media, etc.) are incurred.

In some embodiments, the dual-sided tape embedded system 300 utilizes two 5.25 half-height tape embedded drives. When stacked together, the two half-height drives form a dual-sided tape embedded system 300 that fits in a 5.25 full height bay. This allows users to double the amount of drives in the same number of 5.25 bays.

As will be apparent, other variations on the dual-sided tape embedded system 300 are possible. For example, other form factors such as two 3.5 form factor drives can be used. The individual tape embedded drives of the system 300 may use single HSAs, dual HSAs, or even more HSAs. The tape media may be single sided or double sided. Furthermore, while the above has discussed the PCBA 302 alternating control of the two drives 100, 101, other embodiments can include a more powerful PCBA that is capable of controlling both tape embedded drives simultaneously to increase performance. Also, the drives in the dual-sided tape embedded system may have different components and/or arrangements than as shown in FIGS. 1A-2 and 6. For example, a different recording head system than as shown in FIGS. 1A-2 and 6 may be used. For example, one or more tape head assemblies similar to tape bar 605, or a similar head array of multiple read heads, multiple write heads and/or multiple read and write heads may be used. Conversely, the embodiments of FIGS. 1A-2 and 6 may be implemented in a single tape embedded drive, without regard to the actual location at which the PCBA is mounted (e.g., outside the casing/enclosure).

Printed Circuit Board Assembly Embodiments

Figure 4:
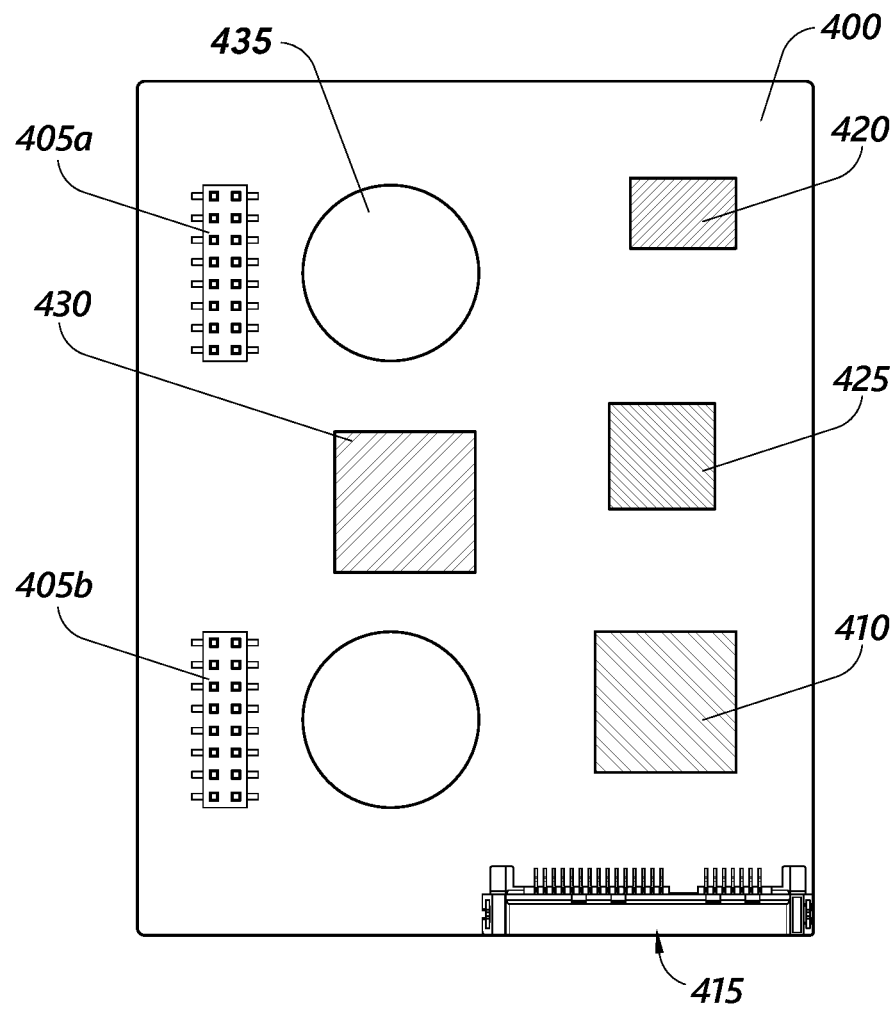
FIG. 4 illustrates a top perspective view of a printed circuit board assembly of the tape embedded drive, in accordance with some embodiments.

FIG. 4 illustrates a top perspective view of a PCBA 400 of the tape embedded drive 100, according to certain embodiments. In some embodiments, the PCBA 302 of FIG. 3B is structurally similar to the PCBA 400 of FIG. 4. In other embodiments, the PCBA 302 may exclude some of the components of PCBA 400 or may include additional components.

As similarly shown in FIG. 1 B, the PCBA 400 can be attached to the bottom surface of the casing 105. One or more connectors 405a, 405b (collectively 405) can attach to contacts or an interface on the bottom surface, the contacts electrically / electronically connected to internal components in the casing. For example, the contacts or interface may be electrically connected to one or more motors, actuators, and/or heads within the casing. The illustrated embodiment has two connectors 405a, 405b; other embodiments may use a single connector or more than two connectors.

In an embodiment, the contacts/interface are built into the casing without compromising an airtight seal of the casing. For example, sealing material may be used to keep the casing air-tight around the contacts/interfaces. In some embodiments, the connector(s) 405 can be an electrical feed-through electrically connecting components inside the casing to those on the PCBA, while maintaining sealing of the casing. For example, an electrical feed-through similar to those found in sealed helium disk drives can be used, such as that described in U.S. Pat. No. 9,672,870, titled "Sealed bulkhead electrical feed-through X-Y positioning control," issued on Jun. 6, 2017 and assigned to the assignee of this disclosure, the disclosure of which is incorporated by reference.

The PCBA 400 can include various components, such as one or more controllers, one or more connectors 405a, 405b(collectively 405), an SoC 410, one or more data interfaces 415 (e.g., SATA, SAS, NVMe or the like), memory 420, a Power Large Scale Integration (PLSI) 425, and/or data read channel controller 430. In some embodiments, most or even all of these components on the PCBA 400 may be similar to components used in HDD drives, though in other embodiments they may include components similar to those in tape drives. In some embodiments, as the PCBA 400 for the tape embedded drive 100 has similar functionality to the PCBA in a HDD (e.g., control read/write heads, move HSAs, transfer data from heads, etc.), the same or at least similar PCBA designs used in HDDs can be used. Furthermore, HDD firmware could similarly be used with only some modification. These factors can contribute in reducing costs of the tape embedded drive 100.

One or more cutouts 435 can be added in the PCBA to provide additional space for tape reel motors, if needed. For example, the portion of the casing above the tape reel spindle motors 151 may be raised to provide additional space for the motors. By providing cutouts 435, the thickness of the tape embedded drive 100 can be reduced as the PCBA 400 can surround the raised portion of the casing.

The PCBA 400 can extend along the entire bottom exterior surface of the casing 105 or may only partially extend along the surface, depending on how much space the various components need. In some embodiments, a second PCBA may be located internally in the casing 105 (of FIG. 1B) and be in communication with the first PCBA 400, for example, via the connector(s) 405.

In some embodiments, a controller on the PCBA 400 controls the read and write operations of the tape embedded drive 100. The controller can engage the tape spool motors and cause the tape spools to wind the tape film forward or backwards. The controller can use the stepping motor and the voice coil motor to control placement of the head(s) over the tape media. The controller can read or write data from the heads of the tape embedded drive 100. For example, the controller can obtain data from the tape media by reading data from the heads via a data channel from the head and associated structures (e.g., HSA, HGA, support structure, flex cable etc.), through an output connector of the drive, and connectors and traces on the PCBA. The controller can also control output/input of data to or from the tape embedded drive 100 through the one or more interfaces 415 such as SATA or SAS.

Dimension Considerations

Figure 5:
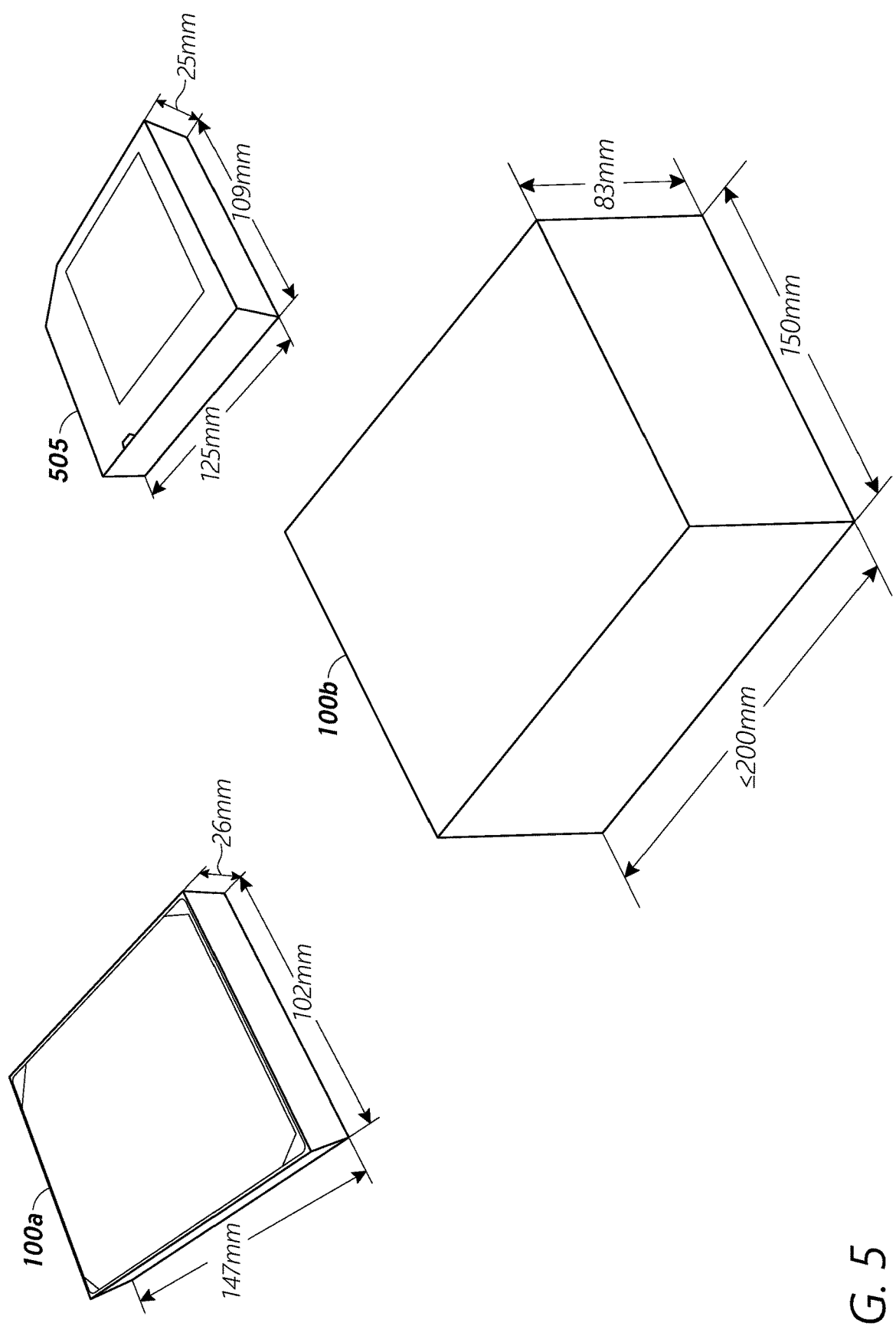
FIG. 5 illustrates a perspective view of a 3.5 inch form factor tape embedded drive 100a, a 5.25 inch form factor tape embedded drive 100b, and a Linear Tape Open tape cassette

FIG. 5 illustrates a perspective view of a 3.5 inch form factor tape embedded drive 100*a*, a 5.25 inch form factor tape embedded drive 100*b*, and an LTO tape cassette, according to certain embodiments. In one embodiment, the 3.5 inch tape embedded drive 100*a* has a length of 147 mm, a width of 102 mm and a height of 26 mm. In one embodiment, the 5.25 inch tape embedded drive 100*b* has a length <=200 mm, a width of 150 mm and a height of 83 mm. An LTO cassette 405 has dimensions of a length of 125 mm, a width of 109 mm and a height of 25 mm. While the above discloses one set of possible dimensions for the tape embedded drive, other embodiments may have different dimensions. For example, the height might be doubled or otherwise increased to allow larger tape film with a larger data capacity to be used. In another example, the 5.25 inch tape embedded drive 100*b* may be half-height, with a height of around 41 mm. Furthermore, small variations in the dimensions are possible while still allowing the drives to fit into standard size drive bays (e.g., 3.5 inch drive bat, 5.25 inch full bay or half-bay, etc.). Greater variations are also possible if compatibility with standard size drive bays are not needed.

The size (length×wide×height) of the tape embedded drive with PCBA can be changed to optimize for access time and/or storage capacity. For faster access time, the tape film length should be shorter. Shorter tape film length can lead to shorter length and/or width size of the casing for the tape embedded drive, but at the potential cost of reduced total data capacity. For increased capacity, the casing can be lengthened in width and/or length to store longer total tape length, but at the potential cost of longer access time. For example, as the 5.25 inch form factor is larger than the LTO form factor, a 5.25 inch tape embedded drive 100*b* can store more data by maximizing the tape length. Furthermore, having more tape media reduces the number of supporting components per length of tape.

In some embodiments, the tape film width may be increased from the standard 12.65 mm used in LTO cassettes to a wider film. Increasing the tape width can increase capacity without necessarily having much effect on access time, as the overall tape length could stay the same, in some embodiments. Data storage can also be increased by enlarging the diameter of the tape reels compared to tape reels of LTO cassettes.

While the above discusses the tape embedded drive as having a casing with a 3.5 inch like that of HDDs or 5.25 inch form factor of other drives or of legacy HDDs, the tape embedded drive 100 can use other form factors. For example, if tape technology becomes sufficiently miniaturized in the future, then the tape embedded drive could use a 2.5 inch drive form factor, like that used by laptop HDDs. Further, the tape embedded drive 100 can use the 3.5 and 5.25 inch form factors with some variations. For example, the drive may be slightly longer/shorter, slightly thicker/thinner, or the like. Even with slight differences in dimensions or placement of data/power interfaces, the drive 100 may still be compatible with existing 3.5 inch or 5.25 inch based infrastructure found in various computer equipment, such as racks and servers.

Figure 6:
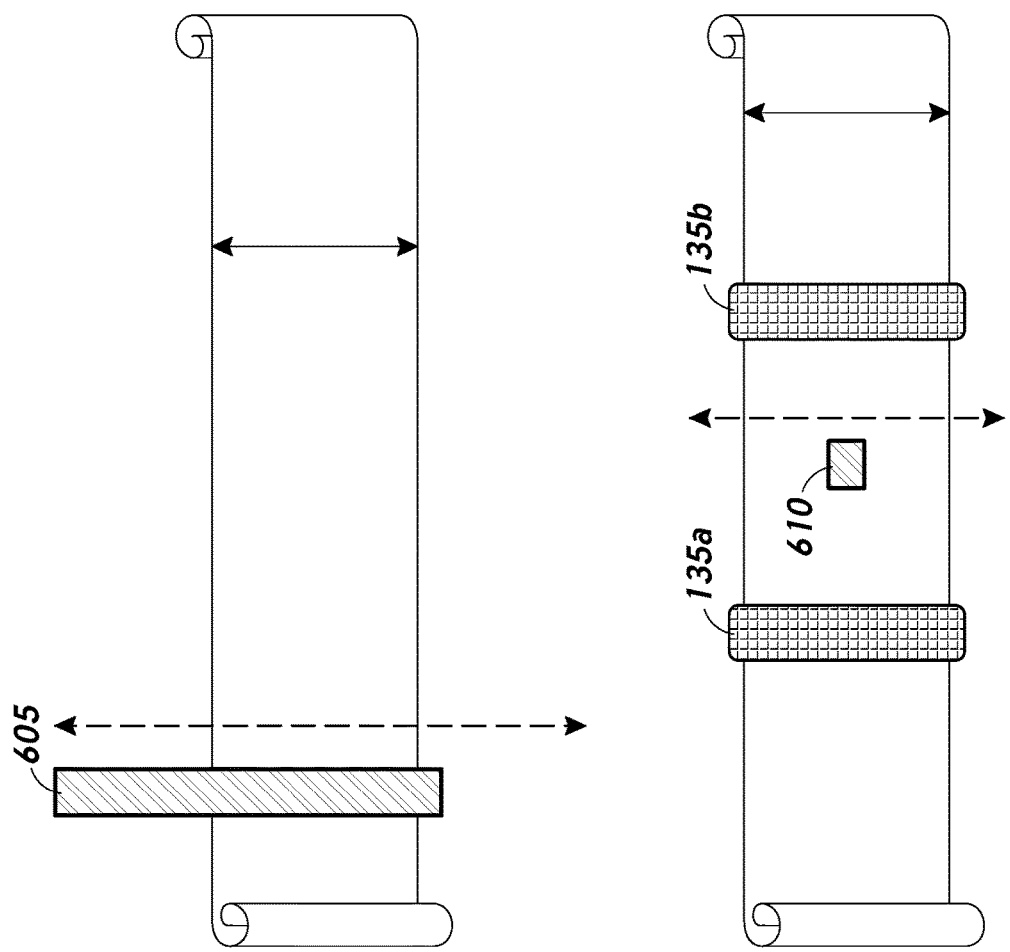
FIG. 6 illustrates a Linear Tape Open head bar and a head assembly for the tape embedded drive, in accordance with some embodiments.

FIG. 6 illustrates an LTO head bar 605 and a head assembly 610 for the tape embedded drive 100, according to certain embodiments. FIG. 6 shows an approximate relationship between tape width and tape head bar length for LTO and for an embodiment of the tape embedded drive.

Multiple writers and readers can be located in a head bar. For example, a tape bar could have 1-10 reader heads and/or 1-10 writer heads. Typically, a tape head bar uses a writer-reader-writer layout. However, other layouts, such as writer-reader-reader-writer could be used. In some embodiments, using two or more readers provides better signal-to-noise ratio (SNR), allowing for higher TPI.

Tape recording uses head film contact technology for recording. Typically, an LTO tape uses four data bands on the film, in which the head(s) are moved to four different locations up and down the width of the tape. The stepping motor is used to move to each of the four locations, with the voice coil motor handling finer actuation within each location. Thus, an LTO cassette uses a longer head bar length (e.g. 22.4 mm) than the tape width (12.65 mm) so that the tape width is covered by the head bar in each of the four locations it may move to.

Due to the heavy mass of the longer head bar 605, wider head reader width and limited movement granularity of the stepping and voice coil motors, the track density on the film for an LTO cassette is limited. An LTO-7 track pitch is 10.7k TPI (2.37 um).

In one embodiment, the tape embedded drive 100 comprises significantly smaller read or write head(s) than an LTO head bar 605, such as a head(s) of about 4 mm in length. Furthermore, other head sizes such as about 3 mm, about 5 mm or even other sizes. In some embodiments, the head(s) are significantly smaller than the tape width. Multiple heads can be included in the head assembly 610. Alternatively, in some embodiments, tape embedded drive 100 comprises one or more head bars similar to the head bar 605.

In one embodiment, two tape guides 615 are located on both sides of the tape assembly. The tape guides limit the movement of the tape and provide better stability when the HGA is moving over the tape film. In other embodiments, only a single tape guide placed either before or after the HGA may be utilized.

The head assembly 610 can be supported by an HDD-like HGA (as discussed in FIG. 2). This can provide gentler and/or more stable head to film contact, potentially providing better reliability for reading and/or writing. The gimbal assembly could use a variety of materials, such as stainless steel or the like.

Additional Embodiments

Those skilled in the art will appreciate that in some embodiments, other types of tape embed drive systems can be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions, and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A storage system comprising:
   a first tape storage device comprising:
      a first enclosure;
      a first head assembly;
      a first actuator for actuating the first head assembly over tape media; and
      a first connector formed on a first back surface of the first enclosure, the first connector electrically coupled to at least one component of the first tape storage device;
   a second tape storage device comprising:
      a second enclosure;
      a second head assembly;
      a second actuator for actuating the second head assembly over tape media; and
      a second connector formed on a second back surface of the second enclosure, the second connector electrically coupled to at least one component of the second tape storage device; and
   a printed circuit board assembly (PCBA) comprising:
      a first side having a first mating connector configured to connect to the first connector for the first tape storage device;
      a second side opposite the first side, the second side having a second mating connector configured to connect to the second connector for the second tape storage device; and
      a controller configured to control activation of the first actuator of the first tape storage device and the second actuator of the second tape storage device;
   wherein the first tape storage device is coupled back-to-back with the second tape storage device, with the PCBA between first tape storage device and the second tape storage device.

2. The storage system of claim 1, further comprising a first motor of the first tape storage device and a second motor of the second tape storage device.

3. The storage system of claim 2, wherein the first motor and the second motor are spindle motors for tape reels for the tape media.

4. The storage system of claim 1, wherein the first tape storage device comprises a tape reel larger in diameter than a standard Linear Tape-Open cartridge.

5. The storage system of claim 1, wherein the first head assembly comprises at least one array of a plurality of read heads, a plurality of write heads, or a plurality of read and write heads.

6. The storage system of claim 1, wherein the first head assembly comprises a first head stack assembly comprising at least one read head and one write head.

7. The storage system of claim 6, wherein the first connector comprises a data channel to the at least one read head and one write head of the first head stack assembly.

8. The storage system of claim 7, wherein the controller is further configured to obtain data from a tape media of the first tape storage device through the data channel.

9. The storage system of claim 1, wherein the controller is only capable of controlling one tape storage device at a time.

10. The storage system of claim 9, wherein the controller is further configured to alternate between controlling the first tape storage device and the second tape storage device.

11. The storage system of claim 1, wherein the first head assembly comprises a first head stack assembly that comprises:
    a first head assembly comprising at least one read head and one write head; and
    a second head assembly comprising a non-operable head incapable of reading or writing;
    wherein the first head assembly is configured to be placed along a first side of the tape media and the second head assembly is configured to be placed along a second side of the tape media opposite the first side of the tape media.

12. A printed circuit board assembly (PCBA) for controlling a pair of tape storage devices, the PCBA comprising:
    a first side having a first mating connector configured to connect to a first connector of a first tape storage device;
    a second side opposite the first side, the second side having a second mating connector configured to connect to a second connector for a second tape storage device; and
    a controller configured to control activation of a first electrical component of the first tape storage device and a second electrical component of the second tape storage device;
    wherein the first tape storage device is coupled back-to-back with the second tape storage device, with the PCBA between first tape storage device and the second tape storage device.

13. The PCBA of claim 12, wherein the first connector comprises a data channel to a read head of the first tape storage device.

14. The PCBA of claim 13, wherein the controller is further configured to obtain data from a tape media of the first tape storage device through the data channel.

15. The PCBA of claim 12, wherein the controller is only capable of controlling one tape storage device at a time.

16. The PCBA of claim 12, wherein the controller is further configured to alternate between controlling the first tape storage device and the second tape storage device.

17. A storage system comprising the PCBA of claim 12.

18. A storage system comprising:
    a first tape storage device comprising:
       a first enclosure;
       a first head assembly;

a first actuator for actuating the first head assembly over tape media; and
a first means for electrically coupling to at least one component of the first tape storage device;
a second tape storage device comprising:
a second enclosure;
a second head assembly;
a second actuator for actuating the second head assembly over tape media; and
a second means for electrically coupling to at least one component of the first tape storage device; and
a printed circuit board assembly (PCBA) comprising:
a first side having a first mating connector configured to connect to the first means for electrically coupling to the first actuator;
a second side opposite the first side, the second side having a second mating connector configured to connect to the second means for electrically coupling to the first actuator; and
means for controlling activation of the first actuator of the first tape storage device and the second actuator of the second tape storage device;
wherein the first tape storage device is coupled back-to-back with the second tape storage device, with the PCBA between first tape storage device and the second tape storage device.

19. The storage system of claim 18, wherein the means for controlling is only capable of controlling one tape storage device at a time.

20. The storage system of claim 18, wherein the means for controlling is further configured to alternate between controlling the first tape storage device and the second tape storage device.

* * * * *